United States Patent
Miyazato

(10) Patent No.: US 11,262,399 B2
(45) Date of Patent: Mar. 1, 2022

(54) METHOD OF DETERMINING WHETHER A SILICON-CARBIDE SEMICONDUCTOR DEVICE IS A CONFORMING PRODUCT

(71) Applicant: FUJI ELECTRIC CO., LTD., Kawasaki (JP)

(72) Inventor: Masaki Miyazato, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 3 days.

(21) Appl. No.: 16/806,614

(22) Filed: Mar. 2, 2020

(65) Prior Publication Data
US 2020/0292612 A1  Sep. 17, 2020

(30) Foreign Application Priority Data

Mar. 14, 2019 (JP) .............................. JP2019-047714

(51) Int. Cl.
*G01R 31/28* (2006.01)
*H01L 29/16* (2006.01)
*H01L 29/78* (2006.01)

(52) U.S. Cl.
CPC ...... *G01R 31/2831* (2013.01); *H01L 29/1608* (2013.01); *H01L 29/7805* (2013.01); *H01L 29/7813* (2013.01)

(58) Field of Classification Search
CPC ............ G01R 31/2621; G01R 31/2632; G01R 31/2648; G01R 31/2831; G01R 31/2855; G01R 31/2877; H01L 29/0623; H01L 29/0878; H01L 29/1608; H01L 29/7805; H01L 29/7813
See application file for complete search history.

(56) References Cited

U.S. PATENT DOCUMENTS

| | | | | |
|---|---|---|---|---|
| 7,768,017 B2* | 8/2010 | Nakayama | .......... | H01L 29/1608 257/77 |
| 2008/0265975 A1* | 10/2008 | Takasu | ............... | H03K 17/6877 327/374 |
| 2016/0003889 A1 | 1/2016 | Watanabe et al. | | |
| 2016/0189982 A1* | 6/2016 | Iguchi | ................. | H01L 29/1608 438/118 |
| 2020/0006066 A1* | 1/2020 | Konishi | ............ | H01L 21/02502 |

FOREIGN PATENT DOCUMENTS

JP   2015-065250 A   4/2015
WO   2014/148294 A1  9/2014

* cited by examiner

*Primary Examiner* — Son T Le
*Assistant Examiner* — Adam S Clarke
(74) *Attorney, Agent, or Firm* — Rabin & Berdo, P.C.

(57) ABSTRACT

A method of determining whether a silicon-carbide semiconductor device, which has a metal oxide semiconductor (MOS) gate structure and a built-in diode, is a conforming product. The method includes measuring an ON voltage of the silicon carbide semiconductor device, passing a forward current through the built-in diode of the silicon carbide semiconductor device, measuring another ON voltage of the silicon carbide semiconductor device, which is the ON voltage of the silicon carbide semiconductor device after passing the forward current, calculating a rate of change between the ON voltage and the another ON voltage, and determining that the silicon carbide semiconductor device is a conforming product unless the calculated rate of change is less than 3%.

4 Claims, 4 Drawing Sheets

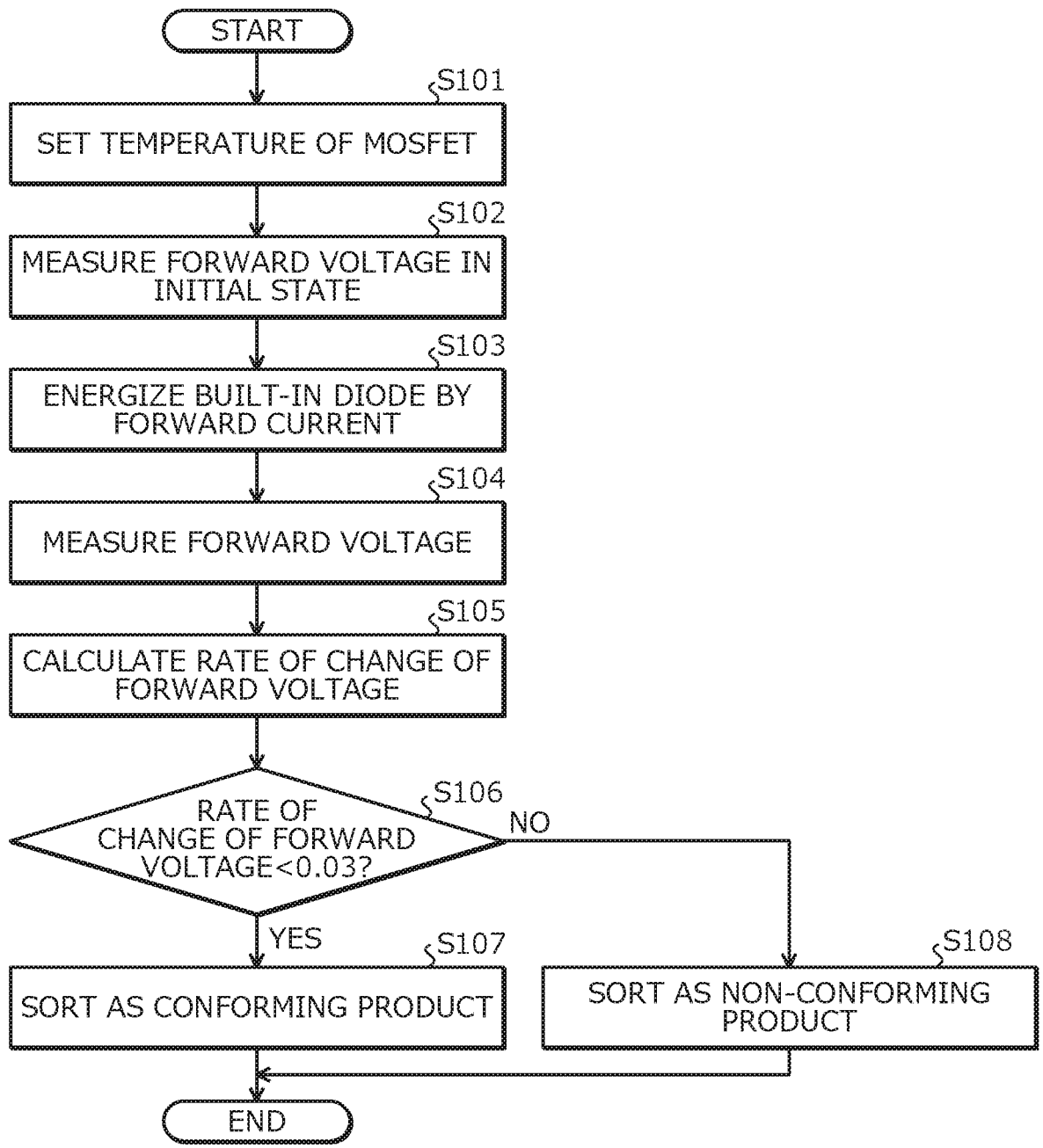

METHOD OF DETERMINING WHETHER A SILICON-CARBIDE SEMICONDUCTOR DEVICE IS A CONFORMING PRODUCT

CROSS REFERENCE TO RELATED APPLICATIONS

This application is based upon and claims the benefit of priority of the prior Japanese Patent Application No. 2019-047714, filed on Mar. 14, 2019, the entire contents of which are incorporated herein by reference.

BACKGROUND OF THE INVENTION

1. Field of the Invention

Embodiments of the invention relate to a method of determining whether a silicon-carbide semiconductor device is a conforming product.

2. Description of the Related Art

Silicon (Si) is used as a material for power semiconductor devices that control high voltage and/or large current. There are several types of power semiconductor devices such as bipolar transistors, insulated gate bipolar transistors (IGBTs), and metal oxide semiconductor field effect transistors (MOSFETs). These devices are selectively used according to an intended purpose.

For example, bipolar transistors and IGBTs have high current density compared to MOSFETs, and can be adapted for large current but cannot be switched at high speeds. In particular, the limit of switching frequency is about several kHz for bipolar transistors and about several tens of kHz for IGBTs. On the other hand, power MOSFETs have low current density compared to bipolar transistors and IGBTs, and are difficult to adapt for large current but can be switched at high speeds up to about several MHz.

There is a strong demand in the market for large-current, high-speed power semiconductor devices. Thus, IGBTs and power MOSFETs have been intensively developed and improved, and the performance of power devices has substantially reached the theoretical limit determined by the material. In terms of power semiconductor devices, semiconductor materials to replace silicon have been investigated and silicon carbide (SiC) has been focused on as a semiconductor material enabling fabrication (manufacture) of a next-generation power semiconductor device having low ON voltage, high-speed characteristics, and high-temperature characteristics.

SiC is a very stable material chemically, has a wide bandgap of 3 eV, and can be used very stably as a semiconductor material even at high temperatures. Further, SiC has a critical electric field strength that is ten times that of silicon or greater, and has a high possibility of exceeding the material limit of silicon. Therefore, future growth is strongly expected for power semiconductor applications, particularly MOSFETs. In particular, ON resistance thereof is expected to be small. Vertical SiC-MOSFETs having even lower ON resistance while maintaining high voltage characteristics can be expected.

A structure of a conventional silicon carbide semiconductor device will be described taking a vertical MOSFET as an example. FIG. 5 is a cross-sectional view of a structure of a conventional silicon carbide semiconductor device. FIG. 5 is an example of a trench-type MOSFET 150. As depicted in FIG. 5, on a front surface of an $n^+$-type silicon carbide substrate 101, an n-type buffer layer 118 is deposited, and on a front surface of the n-type buffer layer 118, an $n^-$-type silicon carbide epitaxial layer 102 is deposited.

In the $n^-$-type silicon carbide epitaxial layer 102, an $n^+$-type region 117, a first $p^+$-type base region 103, a second $p^+$-type base region 104, an n-type high-concentration region 105, and a p-type base layer 106 are selectively provided. Further, at a surface of the p-type base layer 106, an $n^{++}$-type source region 107 and a $p^{++}$-type contact region 108 are selectively provided.

Further, a trench 116 that penetrates through the $n^{++}$-type source region 107 and the p-type base layer 106 and reaches the n-type high-concentration region 105 is provided. Along an inner wall of the trench 116, a gate insulating film 109 is provided on a bottom and side walls of the trench 116 and a gate electrode 110 is provided on the gate insulating film 109 in the trench 116. On surfaces of the $p^{++}$-type contact region 108 and the $n^{++}$-type source region 107, a source electrode 112 is provided and on the source electrode 112, a source electrode pad 115 is provided. Further, on the entire first main surface side of a silicon carbide semiconductor base, an interlayer insulating film 111 is provided so as to cover the gate electrode 110 embedded in the trench 116. Between the source electrode 112 and the interlayer insulating film 111, a barrier metal 114 is provided. Further, on a back surface of the $n^+$-type silicon carbide substrate 101, a back electrode 113 is provided.

The vertical MOSFET with such a structure has built therein as a body diode between a source and a drain, a parasitic pn diode formed by the p-type base layer 106 and the n-type high-concentration region 105. The parasitic pn diode may be operated by an application of high electric potential to the source electrode 112 and current flows in a direction indicated by arrow A in FIG. 5. In this manner, in a MOSFET, unlike in an IGBT, a parasitic pn diode is built in, enabling a freewheeling diode (FWD) used in an inverter to be omitted, thereby contributing to reductions in cost and in size. Hereinafter, a parasitic pn diode of a MOSFET is referred to as a built-in diode.

Nonetheless, defects in the crystal of the $n^+$-type silicon carbide substrate 101 may be present in a silicon carbide semiconductor device. In this case, when current flows in the built-in diode, holes are injected from the $p^{++}$-type contact region 108 and recombination of electrons and holes occurs in the $n^-$-type silicon carbide epitaxial layer 102 or the $n^+$-type silicon carbide substrate 101. Due to recombination energy (3 eV) equivalent to bandgap and generated at this time, basal plane dislocations, which are one type of crystal defect present in the $n^+$-type silicon carbide substrate 101, move and a stacking fault sandwiched between two basal plane dislocations expands.

When a stacking fault expands, the stacking fault does not easily pass current and therefore, ON resistance of the MOSFET and forward voltage of the built-in diode increase. When such operation continues, stacking fault expansion is cumulative and therefore, loss occurring in an inverter circuit increases over time and the amount of generated heat also increases, thereby causing device failure. To prevent this problem, a measure may be taken of preventing current from passing through the built-in diode of the MOSFET by connecting a SiC-Schottky barrier diode (SBD) to the MOSFET in antiparallel.

As an energization inspection technique for a silicon carbide semiconductor device, there is a commonly known technique of setting a temperature of a bipolar semiconductor element in a range from 150 degrees C. to 230 degrees C., continuously passing forward current for which a current density is in a range from 120 A/cm² to 400 A/cm², and when forward resistance is saturated, judging whether a degree of change in forward resistance is less than a threshold (for example, refer to International Publication No. WO 2014/148294). Further, as a method of inspecting a silicon carbide semiconductor device, there is a commonly known technique of passing pulsed current through a diode, obtaining the ON resistance of the diode before and after passing the pulsed current, and judging whether a semiconductor device is defective based on changes in the ON resistance before and after passing the pulsed current (for example, refer to Japanese Laid-Open Patent Publication No. 2015-65250).

SUMMARY OF THE INVENTION

According to an embodiment, a method of determining whether a silicon-carbide semiconductor device, which has a metal oxide semiconductor (MOS) gate structure and a built-in diode, is a conforming product, the method includes measuring an ON voltage of the silicon carbide semiconductor device; passing a forward current through the built-in diode of the silicon carbide semiconductor device; measuring another ON voltage of the silicon carbide semiconductor device, which is the ON voltage of the silicon carbide semiconductor device after passing the forward current; calculating a rate of change between the ON voltage and the another ON voltage; and determining that the silicon carbide semiconductor device is a conforming product unless the calculated rate of change is less than 3%.

In the embodiment, the ON voltage and the another ON voltage are measured by a rated current or a current lower than the rated current.

In the embodiment, the silicon-carbide semiconductor device further includes: a silicon carbide substrate having a front surface and a back surface, a first semiconductor layer of a first conductivity type provided on the front surface of the silicon carbide substrate and having a first side and a second side opposite to the first side and facing the silicon carbide substrate, a second semiconductor layer of a second conductivity type provided on the first side of the first semiconductor layer, a first semiconductor region of the first conductivity type selectively provided in the second semiconductor layer and having an impurity concentration higher than an impurity concentration of the silicon carbide substrate, a trench penetrating the second semiconductor layer and reaching the first semiconductor layer, a gate electrode provided on a gate insulating film in the trench, a first electrode provided on surfaces of the first semiconductor region and the second semiconductor layer, and a second electrode provided on the back surface of the silicon carbide substrate. Each of the ON voltage and the another ON voltage is measured by passing a current from the first electrode to the second electrode.

In the embodiment, the silicon carbide semiconductor device is determined to be a conforming product unless the calculated rate of change is saturated or less than 3%.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 6 is a flowchart of a conventional method of determining whether a silicon-carbide semiconductor device is a conforming product.

DETAILED DESCRIPTION OF THE INVENTION

Figure 1:
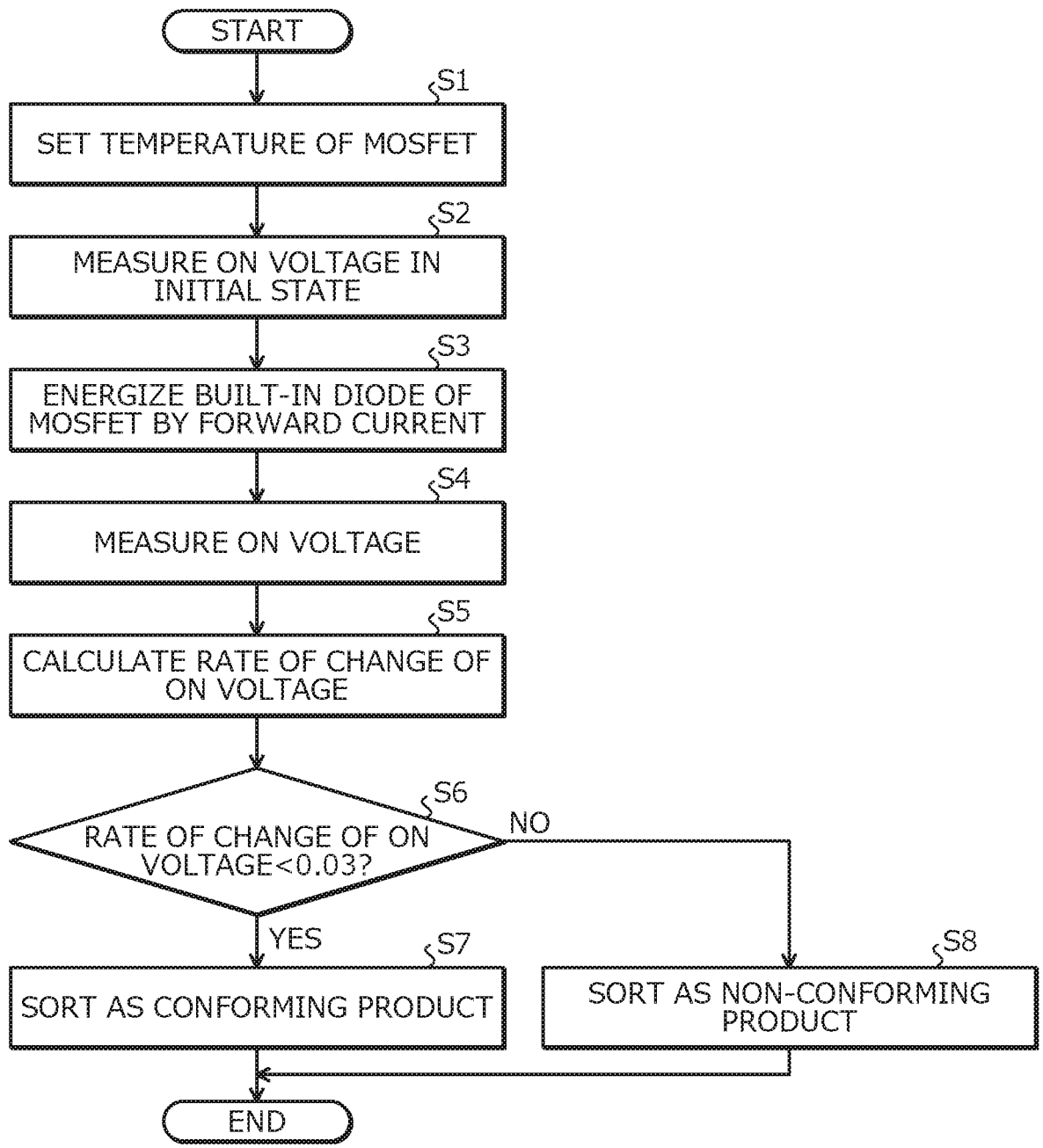
FIG. 1 is a flowchart of a method of determining whether a silicon-carbide semiconductor device is a conforming product according to an embodiment.

First, problems associated with the conventional techniques will be discussed. Even when the SiC-SBD is connected to the MOSFET in antiparallel, at the moment when the MOSFET switches from ON to OFF, current may flow through the built-in diode of the MOSFET and stacking faults of the MOSFET may expand. Therefore, conventionally, silicon carbide semiconductor devices are screened and silicon carbide semiconductor devices without stacking faults are identified.

FIG. 6 is a flowchart of a conventional method of determining whether a silicon-carbide semiconductor device is a conforming product. As depicted in FIG. 6, first, the temperature of the MOSFET is set (step S101). For example, with consideration of the usage environment, the temperature of the MOSFET is set in a range from 100 degrees C. to 250 degrees C. Next, forward voltage in an initial state is measured (step S102). Growth of substrate stacking faults is judged by changes in forward voltage and therefore, the forward voltage in the initial state is measured. Next, the built-in diode of the MOSFET is energized by forward current (step S103). In particular, the gate electrode and the source electrode of the MOSFET are short-circuited, positive voltage is applied to the source electrode, and electric potential of a drain electrode is set to 0. Here, the measured voltage is assumed to be $Vf_0$.

Next, the forward voltage is measured (step S104). Here, the measured voltage is assumed to be $Vf_1$. Next, a rate of change of the forward voltage is calculated (step S105). A rate of change $\Delta Vf$ of the forward voltage is a rate of change from the forward voltage in the initial state. For example, the rate of change $\Delta Vf$ of the forward voltage is obtained by $\Delta Vf = (Vf_1 - Vf_0)/Vf_0$.

Next, it is judged whether the rate of change $\Delta Vf$ of the forward voltage<0.03 (less than 3%) is true (step S106). Here, when the rate of change $\Delta Vf$ of the forward voltage<0.03 is judged to be true (step S106: YES), the MOSFET is determined as a conforming product (step S107). Further, when the rate of change $\Delta Vf$ of the forward voltage is judged to not be <0.03 (step S106: NO), the MOSFET is determined as a non-conforming product (step S108).

Nonetheless, with determination by the rate of change $\Delta Vf$ of the forward voltage, the rate of change $\Delta Vf$ is small and therefore, a non-conforming product may be shipped due to erroneous determination and reliability of the silicon carbide semiconductor device decreases.

Embodiments of a method of determining whether a silicon-carbide semiconductor device is a conforming product according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

Figure 2:
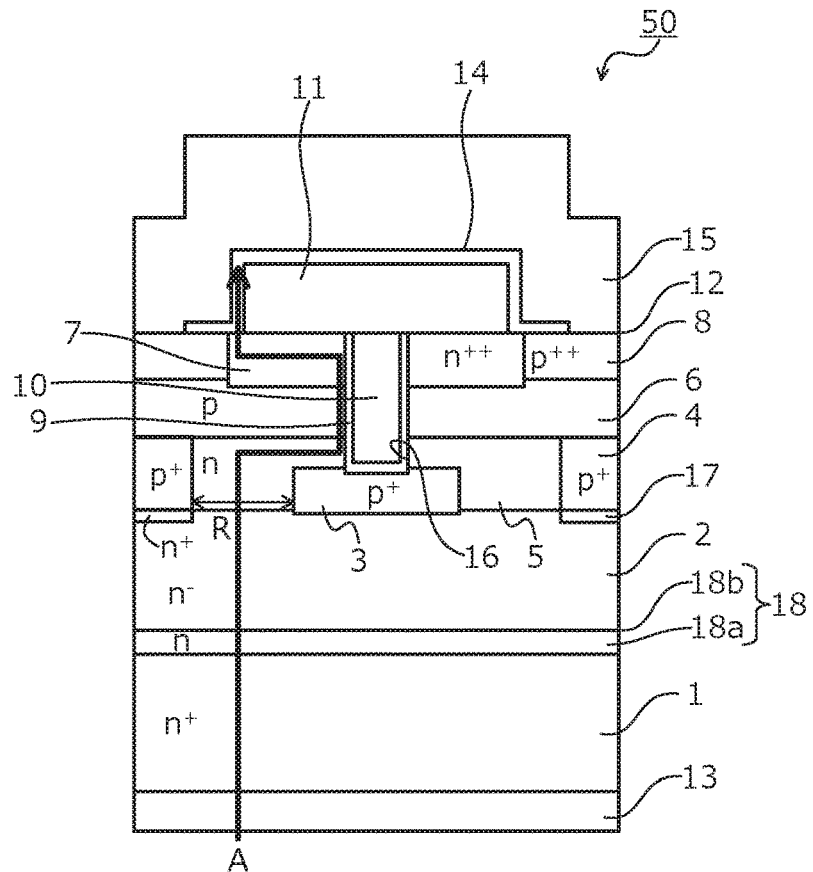
FIG. 2 is a cross-sectional view of a structure of a silicon carbide semiconductor device according to the embodiment.

FIG. 1 is a flowchart of a method of determining whether a silicon-carbide semiconductor device is a conforming product according to an embodiment. Hereinafter, as a silicon carbide semiconductor device, description is given taking a MOSFET as an example and is similar for other silicon carbide semiconductor devices having a MOS gate structure. First, the silicon carbide semiconductor device according to the embodiment will be described. FIG. 2 is a cross-sectional view of a structure of the silicon carbide semiconductor device according to the embodiment.

As depicted in FIG. 2, in the silicon carbide semiconductor device according to the embodiment, on a first main surface (front surface), for example, a (0001) plane (Si-face) of a $n^+$-type silicon carbide substrate 1, an $n^-$-type silicon carbide epitaxial layer (first semiconductor layer of a first conductivity type) 2 is deposited.

Further, an n-type buffer layer 18 may be provided between the $n^+$-type silicon carbide substrate 1 and the $n^-$-type silicon carbide epitaxial layer 2. The n-type buffer layer 18, for example, is formed by two layers including a silicon carbide epitaxial layer (an n-type low-concentration buffer layer 18a) provided on the front surface of the $n^+$-type silicon carbide substrate 1 and doped with nitrogen (N) at a concentration lower than that of the $n^+$-type silicon carbide substrate 1, and a silicon carbide epitaxial layer (an n-type high-concentration buffer layer 18b) provided on a front surface of the n-type low-concentration buffer layer 18a and doped with nitrogen at a concentration higher than that of the $n^+$-type silicon carbide substrate 1. Due to the n-type buffer layer 18, holes generated by a pn interface are prevented from recombining in the n-type buffer layer 18 and reaching the $n^+$-type silicon carbide substrate 1, thereby enabling the generation of stacking faults from the $n^+$-type silicon carbide substrate 1 to be prevented.

The $n^+$-type silicon carbide substrate 1 is a silicon carbide single crystal substrate. The $n^-$-type silicon carbide epitaxial layer 2, for example, is a low-concentration n-type drift layer having an impurity concentration lower than that of the $n^+$-type silicon carbide substrate 1. At a surface of the $n^-$-type silicon carbide epitaxial layer 2, the surface on a first side thereof opposite to a second side thereof facing toward the $n^+$-type silicon carbide substrate 1, an n-type high-concentration region 5 may be provided. The n-type high-concentration region 5 is a high-concentration n-type drift layer having an impurity concentration that is lower than that of the $n^+$-type silicon carbide substrate 1 and higher than that of the $n^-$-type silicon carbide epitaxial layer 2.

On the first side of the $n^-$-type silicon carbide epitaxial layer 2, opposite to the second side thereof facing toward the $n^+$-type silicon carbide substrate 1, a p-type base layer (second semiconductor layer of a second conductivity type) 6 is provided. Hereinafter, the $n^+$-type silicon carbide substrate 1, the $n^-$-type silicon carbide epitaxial layer 2, and the p-type base layer 6 collectively are regarded as a silicon carbide semiconductor base.

On a second main surface (back surface, i.e., back surface of the silicon carbide semiconductor base) of the $n^+$-type silicon carbide substrate 1, a drain electrode forming a back electrode (second electrode) 13 is provided. On a surface of the back electrode 13, a drain electrode pad (not depicted) is provided.

On a first main surface side (side having the p-type base layer 6) of the silicon carbide semiconductor base, a trench structure is formed. In particular, trenches 16 are provided penetrating through the p-type base layer 6 and reaching the n-type high-concentration region 5 (in instances where the n-type high-concentration region 5 is not provided, the $n^-$-type silicon carbide epitaxial layer 2, hereinafter, simply "(2)"), from a surface of the p-type base layer 6, the surface on a first side (the first main surface side of the silicon carbide semiconductor base) thereof opposite to a second side thereof facing toward the $n^+$-type silicon carbide substrate 1. The trenches 16 have a striped planar pattern. Along inner walls of the trenches 16, a gate insulating film 9 is formed on bottoms and side walls of the trenches 16, and gate electrodes 10 are formed on the gate insulating film 9 in the trenches 16. The gate electrodes 10 are insulated from the $n^-$-type silicon carbide epitaxial layer 2 and the p-type base layer 6 by the gate insulating film 9. A portion of each of the gate electrodes 10 may protrude from tops (side where a source electrode pad 15 is provided) of the trenches 16 toward the source electrode pad 15.

In a surface layer of the n-type high-concentration region 5 (2), the surface layer on a first side (the first main surface side of the silicon carbide semiconductor base) there of opposite to a second side thereof facing toward the $n^+$-type silicon carbide substrate 1, second $p^+$-type base regions 4 are selectively provided. First $p^+$-type base regions 3 are formed beneath the trenches 16 and a width of the first $p^+$-type base regions 3 is wider than a width of the trenches 16. The first $p^+$-type base regions 3 and the second $p^+$-type base regions 4, for example, are doped with aluminum. In FIG. 2, while the first $p^+$-type base regions 3 are in contact with the bottoms of the trenches 16, the first $p^+$-type base regions 3 may be provided at positions deeper than the bottoms of the trenches 16. The first $p^+$-type base regions 3 reach positions deeper on a drain side than are the bottoms of the trenches 16.

Provision of the first $p^+$-type base regions 3 and the second $p^+$-type base regions 4 enables formation of pn junctions between the first $p^+$-type base regions 3, the second $p^+$-type base regions 4, and the n-type high-concentration region 5 (2) at positions near the bottoms of the trenches 16 in a depth direction (direction from a source electrode (first electrode) 12 toward the back electrode 13). In this manner, the pn junctions between the first $p^+$-type base regions 3, the second $p^+$-type base regions 4, and the n-type high-concentration region 5 (2) are formed, thereby enabling an application of high electric field to the gate insulating film 9 at the bottoms of the trenches 16 to be prevented. Therefore, even when a wide bandgap semiconductor is used as a semiconductor material, high breakdown voltages are possible.

In the embodiment, in the $n^-$-type silicon carbide epitaxial layer 2, an $n^+$-type region 17 having a peak impurity concentration higher than the n-type high-concentration region 5 (2) is provided between the trenches 16, at positions deeper than those of the second $p^+$-type base regions 4. The peak impurity concentrations of the $n^+$-type regions 17 suffice to be higher than the impurity concentration of the n-type high-concentration region 5 (2) and the impurity concentration throughout the $n^+$-type regions 17 needs not be higher than the impurity concentration of the n-type high-concentration region 5 (2). Further, in a state where the n-type high-concentration region 5 is not provided, the peak impurity concentrations of the n$^+$-type regions 17 is higher than the impurity concentration of the n$^-$-type silicon carbide epitaxial layer 2. Furthermore, the impurity concentration of the n$^+$-type regions 17 may be lower than the impurity concentration of the second p+-type base regions 4.

Due to the n$^+$-type regions 17, a part that determines the breakdown voltage of an element may be set to be the second p$^+$-type base regions 4 between the trenches 16 instead of the first p$^+$-type base regions 3 at the bottoms of the trenches 16. In other words, the breakdown voltage of the first p$^+$-type base regions 3 at the bottoms of the trenches 16 may be set to be higher than the breakdown voltage of the second p$^+$-type base regions 4 between the trenches 16.

Further, in the p-type base layer 6, an n$^{++}$-type source region (first semiconductor region of the first conductivity type) 7 is selectively provided at the first main surface side of the silicon carbide semiconductor base. A p$^{++}$-type contact region 8 may be selectively provided. The n$^{++}$-type source regions 7 and the p$^{++}$-type contact regions 8 contact each other. Further, the p$^{++}$-type contact regions 8 may be selectively provided along a direction in which the striped shape of the trenches 16 extends.

An interlayer insulating film 11 is provided on the first main surface side of the silicon carbide semiconductor base overall so as to cover the gate electrodes 10 embedded in the trenches 16. The source electrode 12 is in contact with the n$^{++}$-type source regions 7 and the p$^{++}$-type contact regions 8 (in instances where the p$^{++}$-type contact regions 8 are not provided, the p-type base layer 6) via contact holes opened in the interlayer insulating film 11. The source electrode 12 is electrically insulated from the gate electrodes 10 by the interlayer insulating film 11. On the source electrode 12, the source electrode pad 15 is provided. Between the source electrode 12 and the interlayer insulating film 11, for example, a barrier metal 14 that prevents diffusion of metal atoms from the source electrode 12 toward the gate electrodes 10 may be provided.

In FIG. 2, while only one cell (structure formed by one of the trenches 16, the gate insulating film 9, one of the gate electrodes 10, the interlayer insulating film 11, and the source electrode 12) is depicted, MOS gate (insulated gate formed by a metal, an oxide film, and a semiconductor) structures of many cells may be further disposed in parallel.

As depicted in FIG. 1, in the method of determining whether a silicon-carbide semiconductor device is a conforming product, first, the temperature of the MOSFET is set (step S1). In the embodiment, the temperature of the MOSFET is set in a range from 100 degrees C. to 250 degrees C. Since MOSFETs employable at 125 degrees C. or higher are identified, a minimum temperature of at least 100 degrees C. is assumed with consideration of a margin. Further, high-temperature solders used in a semiconductor module cannot withstand temperatures higher than 300 degrees C. With consideration of solder wettability, the temperature may be set to 250 degrees C. or less.

Further, setting of the temperature of the MOSFET may be performed by energizing the built-in diode of the MOSFET, for example, is performed by supplying forward current of a constant current density until the MOSFET is within the temperature range above. Here, forward current is current flowing from the source electrode to the drain electrode. Further, in the method of determining whether a silicon-carbide semiconductor device is a conforming product according to the embodiment, accuracy of determination is not dependent on temperature and therefore, the determination may be performed at room temperature, for example, about 25 degrees C. without setting the temperature of the MOSFET.

Next, ON voltage in an initial state is measured (step S2). Growth of substrate stacking faults is judged by changes in the ON voltage and therefore, the ON voltage in the initial state is measured. The ON voltage is the electric potential difference between the drain electrode and the source electrode in a state where current is flowing from the source electrode to the drain electrode, or a state where the MOSFET is in an ON state (i.e., positive voltage is applied to the drain electrode) and gate voltage is gradually increased and current flows from the drain electrode to the source electrode. Herein, the measured ON voltage is assumed to be Von$_0$.

For example, the ON voltage of the MOSFET may be measured by applying positive voltage to the drain electrode in a state where the electric potential of the source electrode is set to be 0, and identifying a voltage Vdson between the source and the drain when current of a predetermined current value flows from the drain electrode toward the source electrode. At this time, the current flows along path A in FIG. 2 described above.

Here, to increase the accuracy of the determination, as the predetermined current value, current lower than a rated current of the MOSFET may be set. For example, a range from 30A to 50A may be used for the predetermined current value. Further, negative voltage of a range from −3V to−7V may be applied as the negative voltage applied to the gate electrode and +15V may be applied to the drain electrode as positive voltage.

Alternatively, measurement may be by applying negative voltage to the source electrode in a state where the electric potential of the drain electrode is set to be 0, and identifying a voltage Vsdon between the source and the drain when current of the predetermined value flows from the source electrode toward the drain electrode. At this time, the current flows in a direction opposite to that of path A in FIG. 2.

In this case as well, to increase the accuracy of the determination, as the predetermined current value, current lower than the rated current of the MOSFET may be set. For example, a range from 30A to 50A may be used for the predetermined current value. Further, negative voltage of a range from −3V to −7V may be applied as the negative voltage applied to the gate electrode and −15V may be applied to the source electrode as negative voltage.

Here, with normal Vdson, pn junctions (for example, the pn junctions between the first p$^+$-type base regions 3 and the n$^-$-type silicon carbide epitaxial layer 2) are reverse biased, a depletion layer spreads from the pn junctions, and current paths become narrower. Therefore, effects of junction field effect transistor (JFET) resistance increase. JFET resistance is resistance between p-type regions (for example, "R" in FIG. 2 below) in an n-type drift layer. The JFET resistance affects the measurement of changes in the ON voltage due to increased resistance by expansion of stacking faults.

On the other hand, with reverse conduction Vsdon, pn junctions are forward biased, no depletion layer spreads from the pn junctions, and current paths do not become narrower. Therefore, effects of the JFET resistance are reduced and no excess resistance components are present, thereby enabling the determination to be performed with higher accuracy than with normal Vdson.

Next, the built-in diode of the MOSFET is energized by forward current (step S3). In particular, the gate electrode and the source electrode of the MOSFET are short-circuited, or negative bias is applied, positive voltage is applied to the source electrode, and the electric potential of the drain electrode is set to 0. Further, in the embodiment, forward current that is DC or has a frequency of 100 kHz or less is passed. Forward current of the built-in diode is current that in the diode formed between the source and the drain of the MOSFET, flows between the source electrode and the drain electrode. Further, forward current of the built-in diode may be passed by applying negative voltage to the drain electrode in a state where the electric potential of the source electrode is set to be 0.

Next, the ON voltage is measured (step S4). the ON voltage is measured by the same method as that at step S2. Here, the measured voltage is assumed to be $Von_1$. Next, a rate of change of the ON voltage is calculated (step S5). A rate of change $\Delta Von$ of the ON voltage is the rate of change from the ON voltage in the initial state. For example, the rate of change $\Delta Von$ of the ON voltage is obtained by $\Delta Von = (Von_1 - Von_0)/Von_0$.

Next, whether the rate of change of the ON voltage<0.03 (less than 3%) is true is judged (step S6). Here, when it is judged that the rate of change of the ON voltage<0.03 is true (step S6: YES), the MOSFET is determined as a conforming product (step S7). On the other hand, when it is judged that the rate of change of the ON voltage<0.03 is not true (step S6: NO), the MOSFET is determined as a non-conforming product (step S8). In this manner, in the embodiment, whether the MOSFET is a conforming product is determined by the rate of change $\Delta Von$ of the ON voltage.

Figure 3:
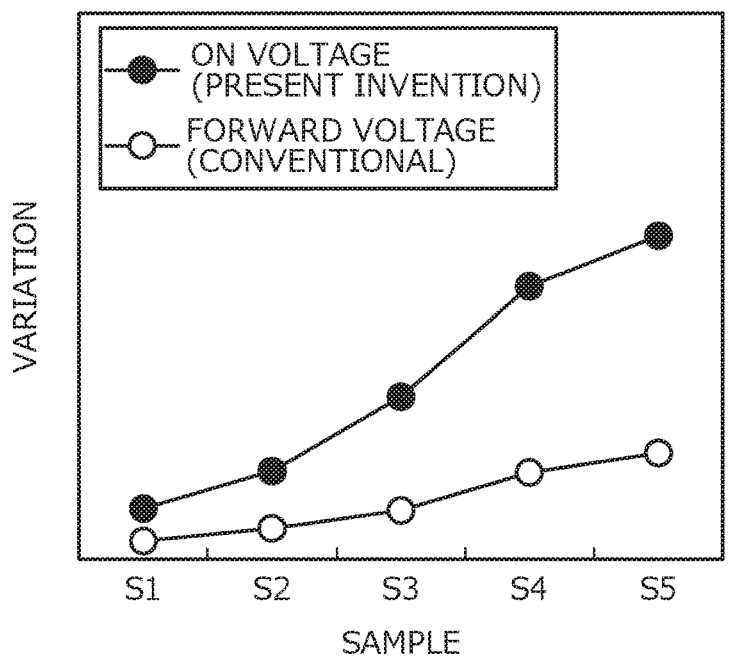
FIG. 3 is a graph depicting a comparison of variation of ON voltage of the silicon carbide semiconductor device and variation of forward voltage.

Here, effects of determining whether the MOSFET is a conforming product by the rate of change $\Delta Von$ of ON voltage will be described. FIG. 3 is a graph depicting a comparison of variation of the ON voltage of the silicon carbide semiconductor device and variation of the forward voltage. In FIG. 3, a horizontal axis indicates samples of the silicon carbide semiconductor device while a vertical axis indicates variation of ON voltage and forward voltage. Further, variation is a difference of the ON voltage or the forward voltage after energization of the built-in diode and the ON voltage or the forward voltage in the initial state, i.e., $Von_1 - Von_0$ or $Vf_1 - Vf_0$.

FIG. 3 depicts results of measurement of the variation of the ON voltage and the variation the forward voltage in the silicon carbide semiconductor device, obtained by passing forward current in the built-in diode under different conditions. For example, the current value is increased, progressing from S1 to S5 and many stacking faults are grown.

As depicted in FIG. 3, the greater is the variation of the forward voltage, the greater is the variation of the ON voltage. Furthermore, in all cases, the variation of the ON voltage is greater than the variation of the forward voltage. Therefore, by determining whether the silicon carbide semiconductor device is a conforming product by the rate of change of the ON voltage, evaluation with a higher sensitivity than determination by the rate of change of the forward voltage is possible. For example, when the rate of change of the forward voltage<0.03 is set, a silicon carbide semiconductor device for which the rate of change of the ON voltage≥0.03 may be determined as a non-conforming product. Therefore, shipping of a non-conforming product due to erroneous determination may be reduced, thereby enabling the reliability of the silicon carbide semiconductor device to be enhanced.

Further, in the embodiment, while the rate of change of the ON voltage is judged by one measurement, the rate of change of the ON voltage may be judged by plural times that the ON voltage does change. Changing of the ON voltage means that substrate stacking faults have grown and the ON resistance has increased. Since the stacking faults may further grow and the rate of change of the ON voltage≥0.03 may become true, the measurement of the ON voltage may be performed plural times until the rate of change of the ON voltage is saturated, and a MOSFET for which the rate of change of the ON voltage is saturated and the rate of change of the ON voltage is less than 3% is identified, whereby determining whether a MOSFET is a conforming product may be performed with further improved accuracy.

When a MOSFET for which the rate of change of the ON voltage is 3% or greater is used in an inverter circuit in which a SiC-SBD is connected in antiparallel to the MOSFET and is used for long-term operation under high temperatures, substrate stacking faults grow and characteristics of the MOSFET degrade. Therefore, this MOSFET is judged as a non-conforming product. On the other hand, when a MOSFET for which the rate of change of the ON voltage is less than 3% is used in the inverter circuit above and even when used for long-term operation under high temperatures of 230 degrees C. or higher, substrate stacking fault growth is low, characteristics of the MOSFET do not degrade, and long-term use may be endured. Here, while 3% is used as a judgment criterion, a less strict condition such as 5% or 10% may be used.

Thus, a series of processes according to the flowchart ends. Execution of the flowchart enables screening for a MOSFET for which reliability does not decrease even with long-term use under high temperatures in an inverter circuit in which a diode is connected in antiparallel to the MOSFET.

Figure 4:
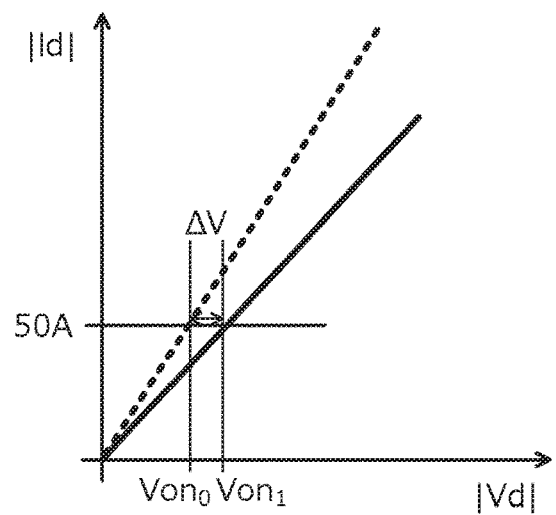
FIG. 4 is a graph of the amount of change of the ON voltage in the method of determining whether a silicon-carbide semiconductor device is a conforming product according to the embodiment.
Figure 5:
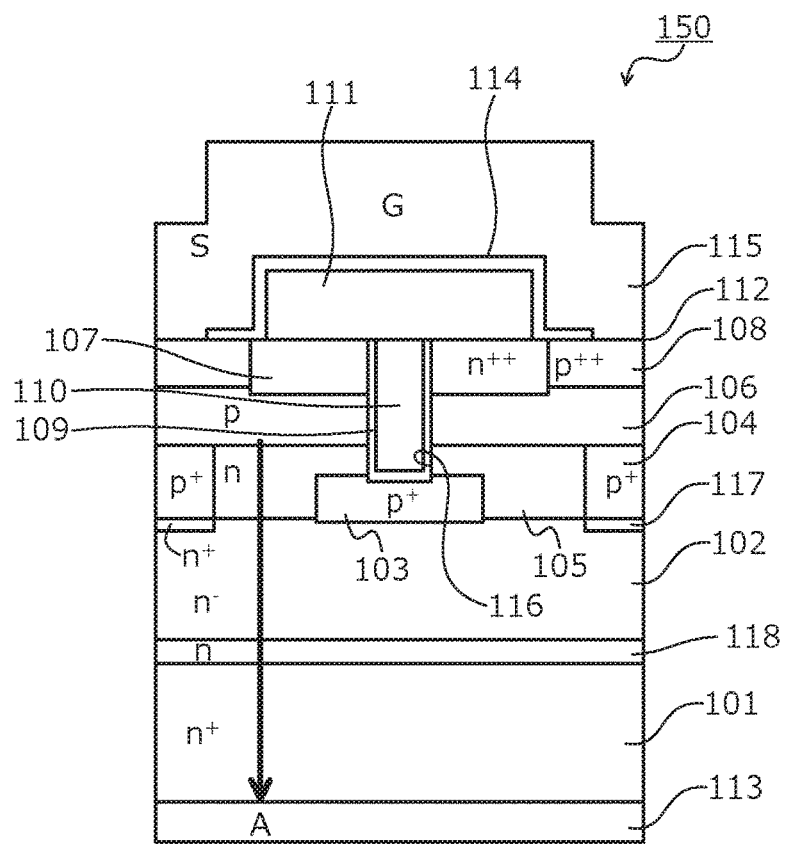
FIG. 5 is a cross-sectional view of a structure of a conventional silicon carbide semiconductor device.

FIG. 4 is a graph of the amount of change of the ON voltage in the method of determining whether a silicon-carbide semiconductor device is a conforming product according to the embodiment. In FIG. 4, a horizontal axis indicates absolute values of ON voltage Vd between the source and the drain in units of V while a vertical axis indicates absolute values of current Id between the source and the drain in units of A. A dotted-lined curve indicates a relationship between the current and the ON voltage in the initial state while a solid-lined curve indicates a relationship between the current and the ON voltage after the built-in diode of the MOSFET is energized by forward current. Since stacking faults expand due to the supply of the forward current and the ON resistance increases, the solid-lined curve ha a smaller slope than that dotted-lined curve.

In FIG. 4, voltage when current of 50A flows in an ON state is measured and the rate of change $\Delta Von$ of the ON voltage is obtained from an amount of change $\Delta V$ from the ON voltage $Von_0$ in the initial state and the voltage $Von_1$ in the ON state after the built-in diode is energized by forward current.

As described above, according to the method of determining whether a silicon-carbide semiconductor device is a conforming product of the embodiment, a silicon carbide semiconductor device in which the rate of change of the ON voltage is less than 3% after forward current is passed through the silicon carbide semiconductor device is identified. As a result, it becomes possible to determine whether a silicon-carbide semiconductor device is a conforming product performed with better sensitivity than in a case of determination by the rate of change of the forward voltage, the shipping of a non-conforming product due to erroneous determination may be reduced, and the reliability of the silicon carbide semiconductor devices may be enhanced.

In the foregoing, various modifications within a range not departing from the spirit of the invention are possible. For example, in the embodiment above, dimensions, impurity concentrations, etc. of parts are set according to required specifications. Further, in the embodiment above, while a case in which silicon carbide is used as a wide bandgap semiconductor material, a wide bandgap semiconductor material other than silicon carbide, for example, gallium nitride (GaN) is applicable as the wide bandgap semiconductor material. In the embodiment, while the first conductivity type is assumed to be an n-type and the second conductivity type is assumed to be a p-type, the present invention is similarly implemented when the first conductivity type is a p-type and the second conductivity type is an n-type.

According to the invention above, a silicon carbide semiconductor device in which the rate of change of the ON voltage is less than 3% after forward current is passed through the silicon carbide semiconductor device is identified. As a result, determination having better sensitivity than in a case of determination by the rate of change of the forward voltage becomes possible, the shipping of a nonconforming product due to erroneous determination may be reduced, and the reliability of the silicon carbide semiconductor devices may be enhanced.

The method of determining whether a silicon-carbide semiconductor device is a conforming product according to the invention achieves an effect in that determination by measurement having better sensitivity than determination by the rate of change of forward voltage may be achieved.

As described, the method of determining whether a silicon-carbide semiconductor device is a conforming product according to the invention is useful for a silicon carbide semiconductor device used in an inverter circuit in which a diode is connected in antiparallel to the silicon carbide semiconductor device.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of determining whether a silicon-carbide semiconductor device, which has a metal oxide semiconductor (MOS) gate structure and a built-in diode, is a conforming product, the method comprising:
   measuring an ON voltage of the silicon carbide semiconductor device;
   passing a forward current through the built-in diode of the silicon carbide semiconductor device;
   measuring another ON voltage of the silicon carbide semiconductor device, which is the ON voltage of the silicon carbide semiconductor device after passing the forward current;
   calculating a rate of change between the ON voltage and the another ON voltage; and
   determining that the silicon carbide semiconductor device is a conforming product when the calculated rate of change is less than 3%.

2. The method according to claim 1, wherein
   the ON voltage and the another ON voltage are measured by a rated current or a current lower than the rated current.

3. The method according to claim 1,
wherein the silicon-carbide semiconductor device further includes:
   a silicon carbide substrate having a front surface and a back surface,
   a first semiconductor layer of a first conductivity type provided on the front surface of the silicon carbide substrate and having a first side and a second side opposite to the first side and facing the silicon carbide substrate,
   a second semiconductor layer of a second conductivity type provided on the first side of the first semiconductor layer,
   a first semiconductor region of the first conductivity type selectively provided in the second semiconductor layer and having an impurity concentration higher than an impurity concentration of the silicon carbide substrate,
   a trench penetrating the second semiconductor layer and reaching the first semiconductor layer,
   a gate electrode provided on a gate insulating film in the trench,
   a first electrode provided on surfaces of the first semiconductor region and the second semiconductor layer, and
   a second electrode provided on the back surface of the silicon carbide substrate; and
wherein each of the ON voltage and the another ON voltage is measured by passing a current from the first electrode to the second electrode.

4. The method according to claim 1, wherein
   the silicon carbide semiconductor device is further determined to be a conforming product when the calculated rate of change is saturated.

* * * * *